United States Patent [19]

Ogata et al.

[11] Patent Number: 5,375,075
[45] Date of Patent: Dec. 20, 1994

[54] SEMICONDUCTOR MEASURING APPARATUS AND METHOD OF PREPARING DEBUGGING PROGRAM

[75] Inventors: Teruaki Ogata; Yuko Sudou, both of Itami, Japan

[73] Assignee: Mitsubishi Denki Kabushiki Kaisha, Tokyo, Japan

[21] Appl. No.: 881,471

[22] Filed: May 11, 1992

[30] Foreign Application Priority Data

Jun. 10, 1991 [JP] Japan ................. 3-136907

[51] Int. Cl.⁵ .................................. G05B 23/00
[52] U.S. Cl. ............................ 364/580; 364/192; 324/73.1
[58] Field of Search ............ 364/580, 578, 191, 192, 364/193, 580; 395/77; 324/73.1

[56] References Cited

U.S. PATENT DOCUMENTS

| | | | |
|---|---|---|---|
| 4,354,268 | 10/1982 | Michel et al. | 324/73.1 |
| 4,654,812 | 3/1987 | Yoshida | 364/578 |
| 4,868,493 | 9/1989 | Becker | 324/73.1 |
| 4,977,531 | 12/1990 | Ogata et al. | 364/580 |
| 5,020,009 | 5/1991 | Ogata et al. | 364/580 |
| 5,020,010 | 5/1991 | Ogata et al. | 364/580 |
| 5,053,981 | 10/1991 | Ogata et al. | 364/580 |
| 5,072,406 | 12/1991 | Ammon | 395/77 |
| 5,122,976 | 6/1992 | Bellows et al. | 364/580 |

*Primary Examiner*—Emanuel T. Voeltz
*Assistant Examiner*—Thomas Peeso
*Attorney, Agent, or Firm*—Leydig, Voit & Mayer

[57] ABSTRACT

A semiconductor measuring apparatus having a measuring test head having a connection portion to which a circuit to be measured may be connected, a monitoring test head for connection to the connection portion of the measuring test head during a debugging operation, a measuring power source connected to the measuring test head, a monitor power source connected to the monitoring test head, an electrical signal measuring device connected to both the measuring test head and the monitoring test head, and a control unit for controlling the measuring power source, the monitor power source, and the electrical signal measuring device, causing the electrical signal measuring device to measure an output signal from the measuring test head during measurement of a circuit and causing the electrical signal measuring device to measure an output signal from the monitoring test head during a debugging operation.

2 Claims, 5 Drawing Sheets

SEMICONDUCTOR MEASURING APPARATUS AND METHOD OF PREPARING DEBUGGING PROGRAM

BACKGROUND OF THE INVENTION

1. Field of the Invention

The present invention relates to an electronic circuit measuring apparatus for measuring, for example, a semiconductor integrated circuit and a method of preparing a debugging program for an electronic circuit measuring apparatus.

2. Description of the Related Art

FIG. 5 illustrates a conventional electronic circuit measuring apparatus 1 of the type described above. A circuit 4 to be measured, such as a semiconductor integrated circuit, is connected to a measuring peripheral circuit 5. The electronic circuit measuring apparatus 1 comprises a plurality of power sources R1 to R4. The power sources R1 to R4 are respectively connected to corresponding pins P1 to P4 of the circuit 4 to be measured via switches SW1 to SW4 disposed in the peripheral circuit 5. The peripheral circuit 5 has a switch SWa connected between the pin P2 of the circuit 4 to be measured and ground. The electronic circuit measuring apparatus 1 further comprises a peripheral circuit control unit 2 for controlling switching on/off of the switches SW1 to SW4 and the switch SWa of the peripheral circuit 5. Furthermore, the electronic circuit measuring apparatus 1 comprises a tester controller 3 for controlling the above-described peripheral circuit control unit 2 and the power sources R1 to R4 in accordance with a program. The peripheral circuit 5 is disposed adjacent to the circuit 4 to be measured in a case where the electronic circuit measuring apparatus 1 cannot realize the measuring specifications or in a case where a problem arises in the measuring operation even if the measuring specifications can be measured by the same.

Then, an operation will now be considered in which a discrimination is made whether or not the characteristics of the circuit 4 measured in accordance with a measuring specification shown in Table 1 are satisfactory.

In order to measure the leakage current 1 and the leakage current 2 of the corresponding parameter Nos. 1 and 2, the following test programs TEST1 and TEST2 are required:

```
TEST1:    Leakage Current 1
          SET SW1 = ON, SW3 = ON
          SET PIN1 = 0.4 V, MEAS. MODE = I
          SET PIN3 = OV
          MEAS PIN1
          JUDGE LO 1 µA, HI 3 µA
TEST2:    Leakage Current 2
          SET SW2 = ON, SW1 = OFF
          SET PIN1 = OFF
          SET PIN2 = 0.4 V, MEAS. MODE = I
          MEAS PIN2
          JUDGE LO 2 µA, HI 4 µA
```

Each of the above-described test programs includes a series sequence control which can be executed by the tester controller 3 of the electronic circuit measuring apparatus 1. In accordance with test programs of the type described above, the switching on/off operation of each of the switches SW1 to SW4 and SWa of the peripheral circuit 5 is controlled by the peripheral circuit control unit 2 of the electronic circuit measuring apparatus 1. As a result, electrical signals are supplied to the circuit 4 to be measured from the power sources R1 to R4 before the output signal from the circuit 4 is measured so that a determined is made as to whether the characteristics are satisfactory. For example, in a case where the leakage current 1 of the TEST1 is measured, the switches SW1 and SW3 are first switched on so that a voltage level of 0.4 V is applied from the power source R1 connected to the pin 1 of the circuit 4 to be measured, while a mode for measuring the electrical current is set. Then, the power source R3 connected to the pin P3 of the circuit 4 to be measured is set to 0 V so that the electrical current passing through the pin P1 is measured.

In this case, a debugging operation must be performed prior to executing the actual measuring operation so as to confirm whether the measuring condition set in accordance with the test program meets the measuring condition shown in the measuring specification. The conventional measuring apparatus shown in FIG. 5 has been arranged in such a manner that the electrical status of each of the pins P1 to P4 of the circuit 4 to be measured is confirmed by connecting a waveform observing device, such as an oscilloscope, to each of the pins P1 to P4. Therefore, the execution of the test program must be interrupted whenever the measuring condition for a single parameter is set so as to perform the debugging operation. Furthermore, another problem arises in that too long a time and too much labor are required to complete the debugging operation because it has been completed by human powers. In addition,

TABLE 1

| Parameter to be measured | | Measuring | Rated Values | | Conditions | | | | | | | | |
|---|---|---|---|---|---|---|---|---|---|---|---|---|---|
| No. | Parameters | Conditions | Minimum | Maximum | P1 | P2 | P3 | P4 | SW1 | SW2 | SW3 | SW4 | SWa |
| 1 | Leak current 1 | $V_F = 0.4$ V, IM | 1 µA | 3 µA | M | | OV | | on | | on | | |
| 2 | Leak current 2 | $V_F = 0.4$ V, IM | 2 µA | 4 µA | | M | OV | | | on | on | | |
| 3 | Circuit current | $V_F = 5$ V, IM | 10 mA | 20 mA | | | OV | M | | | on | on | on |
| 4 | Terminal voltage 1 | $I_F = 0$ µA, VM | 1 V | 2 V | M | | OV | 5 V | on | | on | on | on |
| 5 | Terminal voltage 2 | $I_F = 0$ µA, VM | 2 V | 3 V | | M | OV | 5 V | | on | on | on | on | the level of the quality of the result of the debugging operation cannot be stabilized because it depends upon the debugging operator.

SUMMARY OF THE INVENTION

Accordingly, an object of the present invention is to provide a semiconductor measuring apparatus capable of overcoming the above-described problems and performing a debugging operation while maintaining stable quality testing.

Another object of the present invention is to provide a method of preparing a debugging program with which a debugging operation can automatically be performed.

In order to achieve the above-described objects, according to one aspect of the present invention, there is provided a semiconductor measuring apparatus comprising: a measuring test head having a connection portion to which a circuit to be measured is connected; a test head for a monitor having a monitor terminal for connection to the connection portion of the measuring test head at the time of debugging; measuring power source means connected to the measuring test head; a power source for a monitor connected to the test head for a monitor; electrical signal measuring means connected to both the measuring test head and the test head for a monitor; and control means for controlling the measuring power source means, the power source means for a monitor and the electrical signal measuring means, causing the electrical signal measuring means to measure an output signal from the measuring test head at the time of testing a circuit and causing the electrical signal measuring means to measure an output signal from the test head for a monitor at the time of debugging.

According to another aspect of the present invention, there is provided a method of preparing a debugging program comprising the steps of: reading a test program; defining an extraction key for extracting a set condition at the time of the measurement from a test program which has been read; defining a confirmation condition for confirming whether or not the set condition extracted by using the extraction key is satisfactory; preparing a monitor program for determining whether the set condition is satisfactory in accordance with the confirmation condition; adding to the test program a branch command for branching to the monitor program; adding to the monitor program a return command for returning to the test program; and transmitting a debugging program formed by the test program to which the branch command is added and the monitor program to which the return command is added.

DESCRIPTION OF THE PREFERRED EMBODIMENTS

Preferred embodiments of the present invention will now be described with reference to the drawings.

Figure 1:
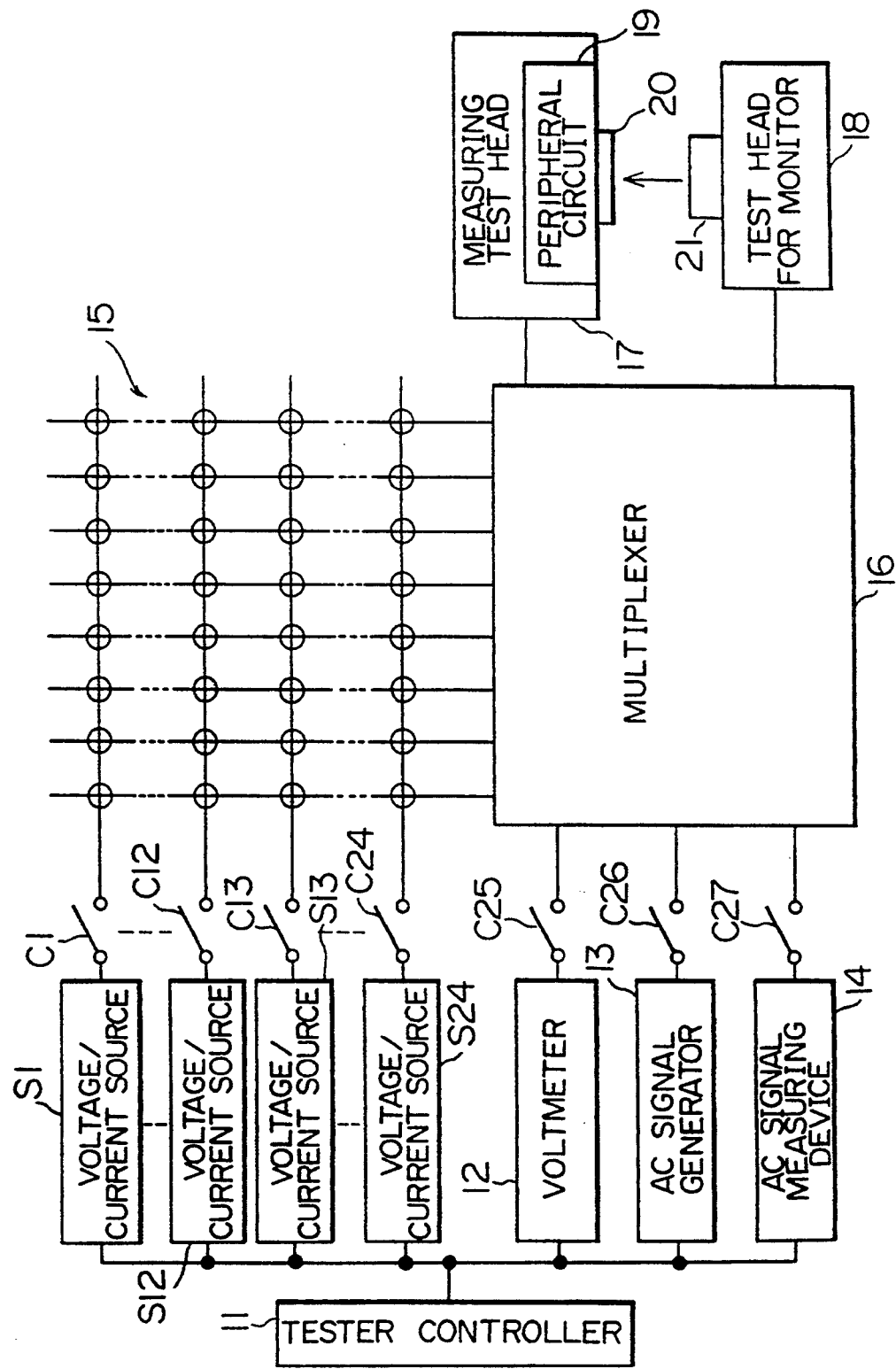
FIG. 1 is a block diagram which illustrates an embodiment of a semiconductor measuring apparatus according to the present invention.

Referring to FIG. 1, voltage/current sources S1 to S24, a voltmeter 12, an AC signal generator 13 and an AC signal measuring device 14 are connected to a tester controller 11. The voltage/current sources S1 to S24 are connected to a multiplexer 16 via corresponding switches C1 to C24 and a pin matrix 15. The voltmeter 12, the AC signal generator 13 and the AC signal measuring device 14 are connected to the multiplexer 16 via corresponding switches C25 to C27.

A measuring test head 17 for receiving a circuit to be measured, i.e., tested, and a test head 18 for confirming test conditions are connected to the multiplexer 16. The measuring test head 17 is provided with a peripheral circuit 19 which has a connection portion 20 to which the circuit to be measured is connected. Therefore, when the circuit to be measured is connected to the connection portion 20, pins P1 to P4 of the circuit to be measured are connected to the corresponding terminals of the peripheral circuit 19. The test head 18 for a monitor has a monitor terminal 21 in the same shape as that of a circuit to be measured and having unillustrated pins P11 to P14 which are arranged in the same configuration of the pins P1 to P4 of the circuit to be measured. That is, by connecting the monitor terminal 21 of the test head 18 to the connection portion 20 of the measuring test head 17, the terminals of the peripheral circuit 19 and the corresponding pins P11 to P14 of the monitor terminal are connected to one another.

The voltage/current sources S1 to S12 of the voltage/current sources S1 to S24, the voltmeter 12, the AC signal generator 13 and the AC signal measuring device 14 are connected to the peripheral circuit 19 of the measuring test head 17 via the multiplexer 16. On the other hand, the voltage/current sources S13 to S24 of the voltage/current sources S1 to S24, the measuring voltmeter 12, and the AC signal measuring device 14 are connected to the test head 18 via the multiplexer 16. That is, the hardware resource possessed by the above-described semiconductor measuring apparatus is divided for the measuring operation and for the monitor. Furthermore, the voltage/current sources S1 to S12 are part of a measuring power source means, the voltage/current sources S13 to S24 are part of a monitor power source means, the voltmeter 12 and the AC signal measuring device 14 are part of an electrical signal measuring means and the tester controller 11 is a control means.

Then, the operation according to this embodiment for testing leakage current 1 of the parameter No. 1 and the leakage current 2 of the parameter No. 2 shown in Table 1 is described. In order to measure those leakage currents, the following test programs are required:

| Execution Line No. | Description of Program |
|---|---|
| 10 | TEST1: Leakage Current 1 |
| 20 | SET SW1 = ON, SW3 = ON |
| 30 | SET PIN1 = 0.4 V, MEAS. MODE = I |
| 40 | SET PIN3 = 0V |
| 50 | MEAS PIN1 |
| 60 | JUDGE LO 1 μA, HI 3 μA |
| 70 | TEST2: Leakage Current 2 |
| 80 | SET PIN1 = OFF |
| 90 | SET PIN2 = 0.4 V, MEAS. MODE = I |
| 100 | MEAS PIN2 |
| 110 | JUDGE LO 2 μA, HI 4 μA |

Figure 2:
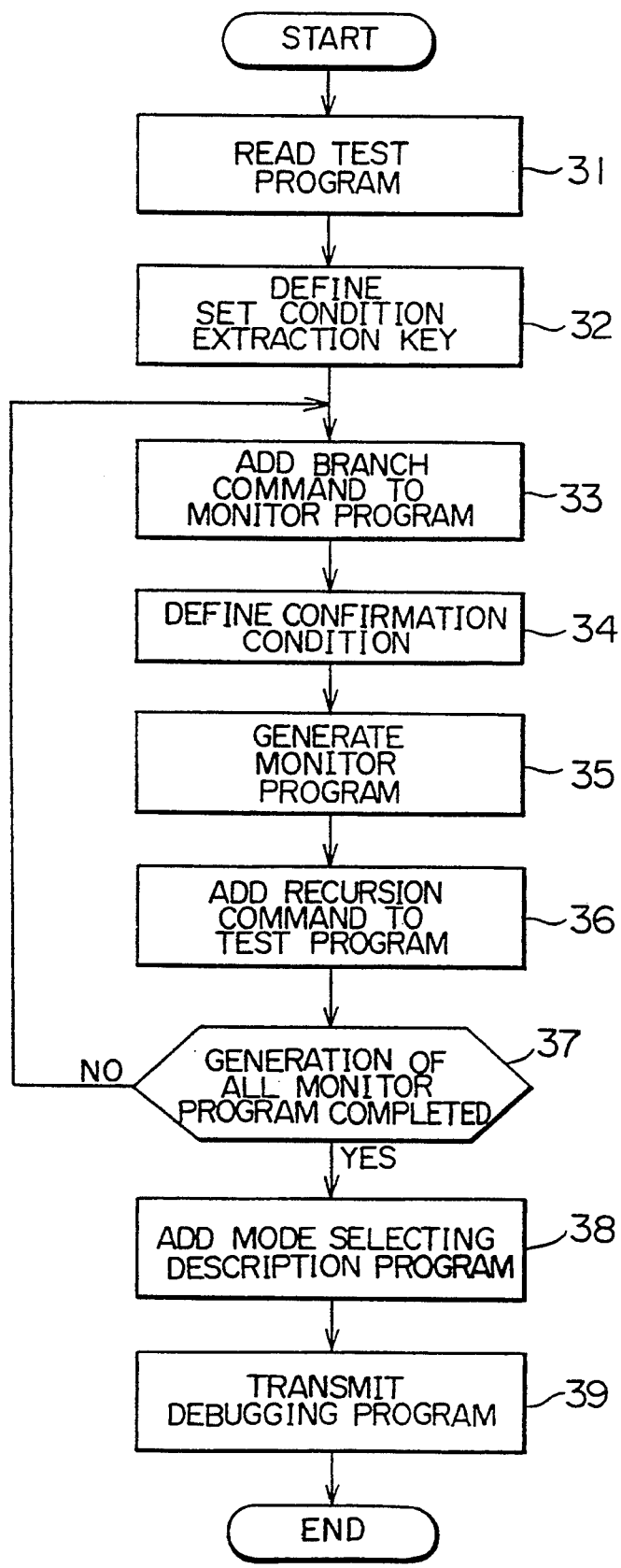
FIG. 2 is a flow chart which illustrates an embodiment of a method of preparing a debugging program according to the present invention.

In accordance with the above-described test program, a debugging program for confirming the measuring condition is processed. Then, a method of processing the debugging program will now be described with reference to a flow chart shown in FIG. 2.

First, the test program is read in step 31. For example, in debugging the program for measuring the leakage current 1 shown in TEST1, the contents of the executions line Nos. 30 and 40 must be confirmed. Therefore, in order to extract the above-described line Nos, "SET PIN" is defined as a setting condition extracting key in step 32. The moment at which the contents of the execution line Nos. 30 and 40 are confirmed is performed after the value of the electrical current passing through the pin P1 has been compared in the execution line No. 60. Therefore, a command to branch the flow to the confirmation program is inserted next to the execution line No. 60 in step 33.

In subsequent step 34, the confirmation condition is defined. For example, where a voltage application is confirmed, the voltage of the subject terminal is measured, while the clamp voltage at the time of applying a constant current is measured with the terminal open. The confirmation conditions corresponding to the parameters measured shown in Table 1 are shown in Table 2.

TABLE 2

| Debugging Parameters | Test Parameters | | Confirmation conditions | | | | | | | | |
|---|---|---|---|---|---|---|---|---|---|---|---|
| No. | Sequence No. | Parameters | P1 | P2 | P3 | P4 | SW1 | SW2 | SW3 | SW4 | SWa |
| 1 | 1 | Leak current 1 | M | | OV | | on | | on | | |
| 2 | 2 | Leak current 2 | open | M | | | off | on | | | |
| 3 | 3 | Circuit current | | open | M | | off | | on | on | |
| 4 | 4 | Terminal voltage 1 | M | | | | on | | on | | |
| 5 | 5 | Terminal voltage 2 | open | M | | | off | on | | | |

A determination as to whether the set condition is suitable is made in accordance with standards, for example, whether a range of a predetermined value ±0.04 V is met. In accordance with the definition about of the confirmation condition, a monitor program is processed in step 35. Then, in step 36, a return command to the test program is added to the end portion of the monitor program.

Then, whether processing of the overall body of the monitor program has been completed is in step 37. If the monitor program has not been completed, steps 33 to 37 are repeated until it is completed. If a determination is made in step 37 that processing of the overall body of the monitor program has been completed, a mode selecting description program for selecting a debugging program execution mode is added in step 38. Thus, processing of the debugging program is completed. In step 39, the processed debugging program is transmitted in a form which can be executed in the subject electronic circuit measuring apparatus.

A debugging program actually processed in accordance with the above-described test program is shown below.

| Execution Line No. | Description of Program |
|---|---|
| 5 | SET MODE = ? |
| 10 | TEST1: Leak Current 1 |
| 20 | SET SW1 = ON, SW3 = ON |
| 30 | SET PIN1 = 0.4 V, MEAS. MODE |
| 40 | SET PIN3 = 0 V |
| 50 | MEAS PIN1 |
| 60 | JUDGE LO 1 μA, HI 3 μA |
| 64 | IF MODE = 1 THEN GOTO TEST2 |
| 65 | GOTO MON1 |
| 66 | COND1: |
| 70 | TEST2: Leak Current 2 |
| 80 | SET PIN1 = OFF |
| 90 | SET PIN2 = 0.4 V, MEAS. MODE = I |
| 100 | MEAS PIN2 |
| 110 | JUDGE LO 2 μA, HI 4 μA |
| 114 | IF MODE = 1 THEN GOTO TEST3 |
| 115 | GOTO MON2 |
| 116 | COND2: |
| 1000 | MON1: |
| 1010 | SET PIN11 MEAS. MODE = V |
| 1020 | MEAS PIN11 |
| 1030 | JUDGE LO 0.36 V, HI 0.44 V |
| 1040 | SET PIN11 = OFF |
| 1050 | SET PIN13 MEAS. MODE = V |
| 1060 | MEAS PIN13 |
| 1070 | JUDGE LO −0.04 V, HI 0.04 V |
| 1080 | GOTO COND1 |
| 2000 | MON2: |
| 2010 | SET PIN11 0.1 μA MEAS. MODE = V CLAMP = 1V |
| 2020 | MEAS PIN11 |
| 2030 | JUDGE LO 0.96 V, HI 1.04 V |
| 2040 | SET PIN11 = OFF |
| 2050 | SET PIN12 MEAS. MODE = V |
| 2060 | MEAS PIN12 |
| 2070 | JUDGE LO 0.36 V, HI 0.44 V |
| 2080 | GOTO COND2 |

The above-described debugging program is processed in such a manner that monitor programs of the execution line Nos. 1000 to 1080 and 2000 to 2080 are added to the above-described test program. Furthermore, the execution line No. 5 for selecting either of the test execution mode or the debug mode and execution line Nos. 64 to 66 and 114 to for branching and return to the monitor program are added to the same. The monitor programs of the execution line Nos. 1000 to 1080 and 2000 to 2080 are used to determine whether the conditions set for each of the parameters of the leakage current 1 and the leakage current 2 to be measured and shown in Table 1 are met. The above-described debugging program is arranged in such a manner that the allowable range for the voltage value at each of the pins P11 to P14 of the monitor terminal 21 is set to ±0.04 V.

After the above-described debugging program has been processed, the monitor terminal 21 of the test head 18 for a monitor is connected to the connection portion 20 of the measuring test head 17. In this state, the debugging program is executed.

Figure 3:
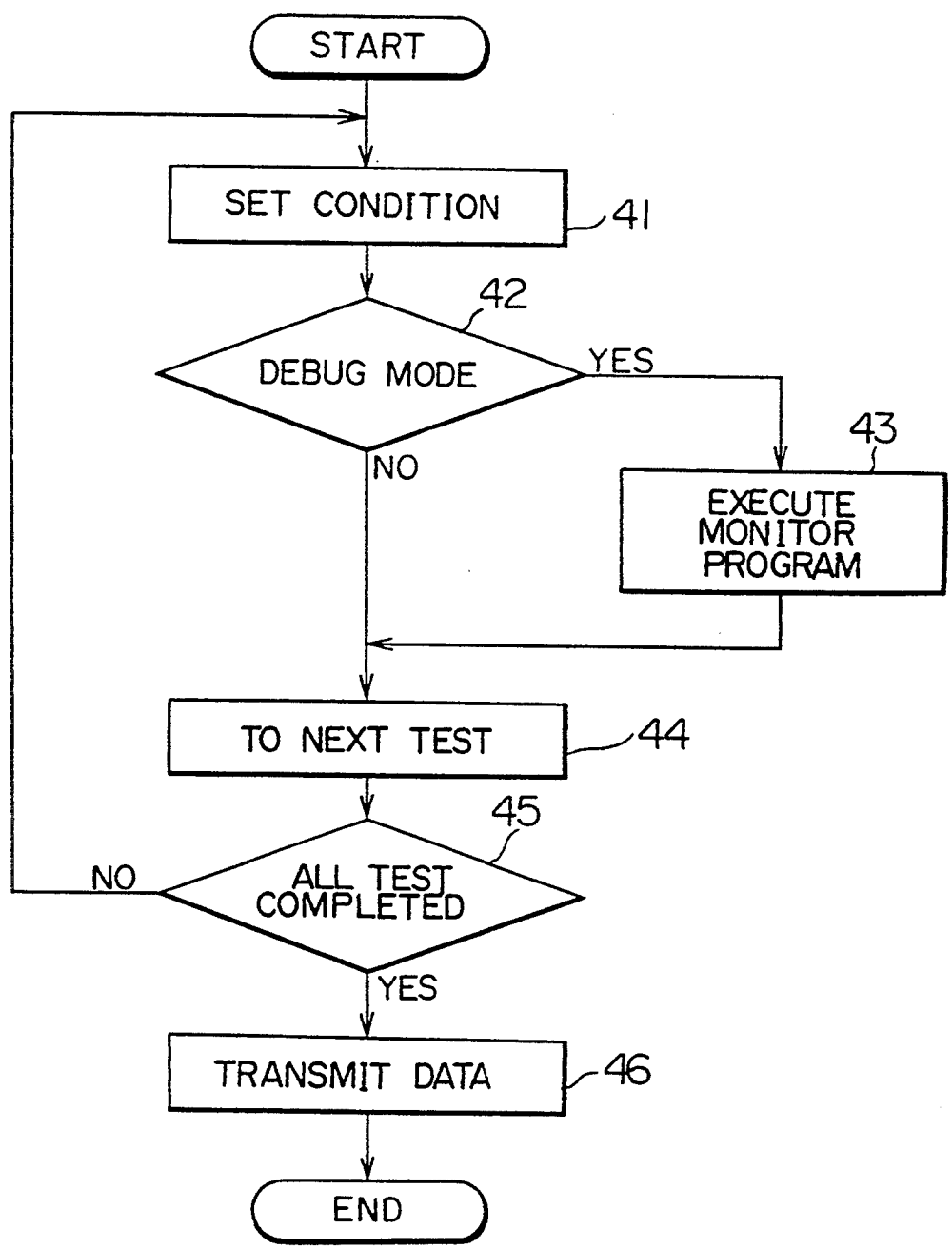
FIG. 3 is a flow chart which illustrates the sequential operational flow in the debugging program.

The flow of the operations performed in accordance with the debugging program is shown in FIG. 3. First, the measuring condition for the parameter to be measured is set in step 41. In step 42, a determination is made as to whether the subject mode is the debug mode. If a determination is made that the subject mode is the debug mode, the flow proceeds to step 43 in which the monitor program is executed. Then, the test for the ensuing parameter is performed in step 44. The above-described operations according to steps 41 to 44 are repeated until a confirmation is, in step 45, made that all of the parameters to be measured are tested. If a confirmation is, in step 45, made that all of the tests have been completed, data obtained from the tests is transmitted in step 46. Since the measuring apparatus according to this embodiment is set in the debugging mode when the debugging operation is performed, the monitor program is, subsequently to step 42, executed in step S43.

During the debugging operation thus-performed, data concerning the determination made about whether the contents of the monitor program are satisfactory is employed among data parameters transmitted in step 46. Therefore, the result of the determination as to whether the contents in the test program are satisfactory is neglected.

Also the above-described debugging program can be used during the execution of the test. In this case, the semiconductor measuring apparatus is set to the test execution mode in which a determination is, in step 42 shown in FIG. 3, made that the subject mode is not the debugging mode before the flow proceeds to step 44 in such a manner that the monitor program in step 43 is not executed. The voltmeter 12 and the AC signal measuring device 14 shown in FIG. 1 are used commonly in the execution of the monitor program at the time of performing the debugging operation and in the measurement operation performed at the time of the test.

Figure 4:
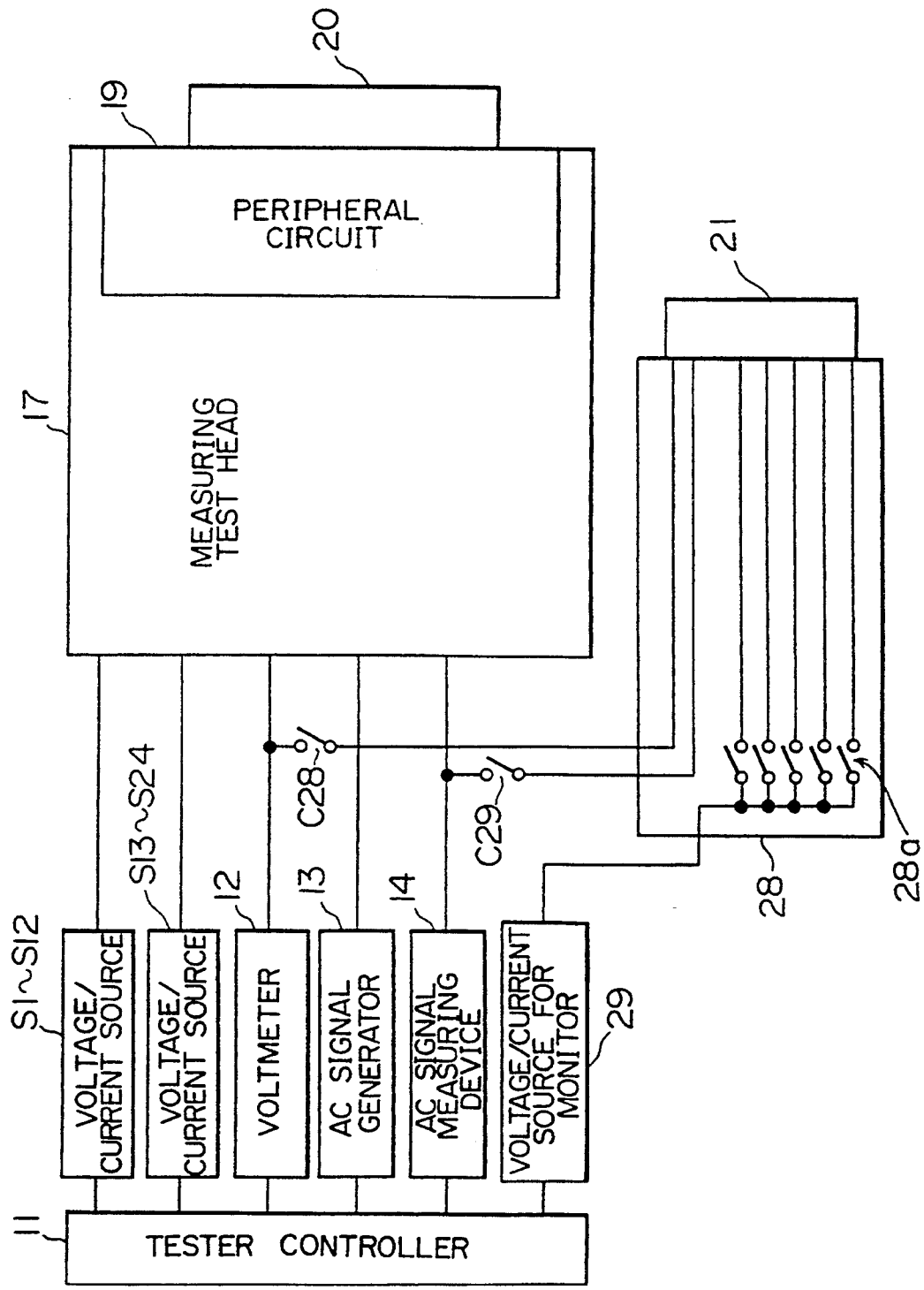
FIG. 4 is a block diagram which illustrates another embodiment of the semiconductor measuring apparatus according to the present invention.
Figure 5:
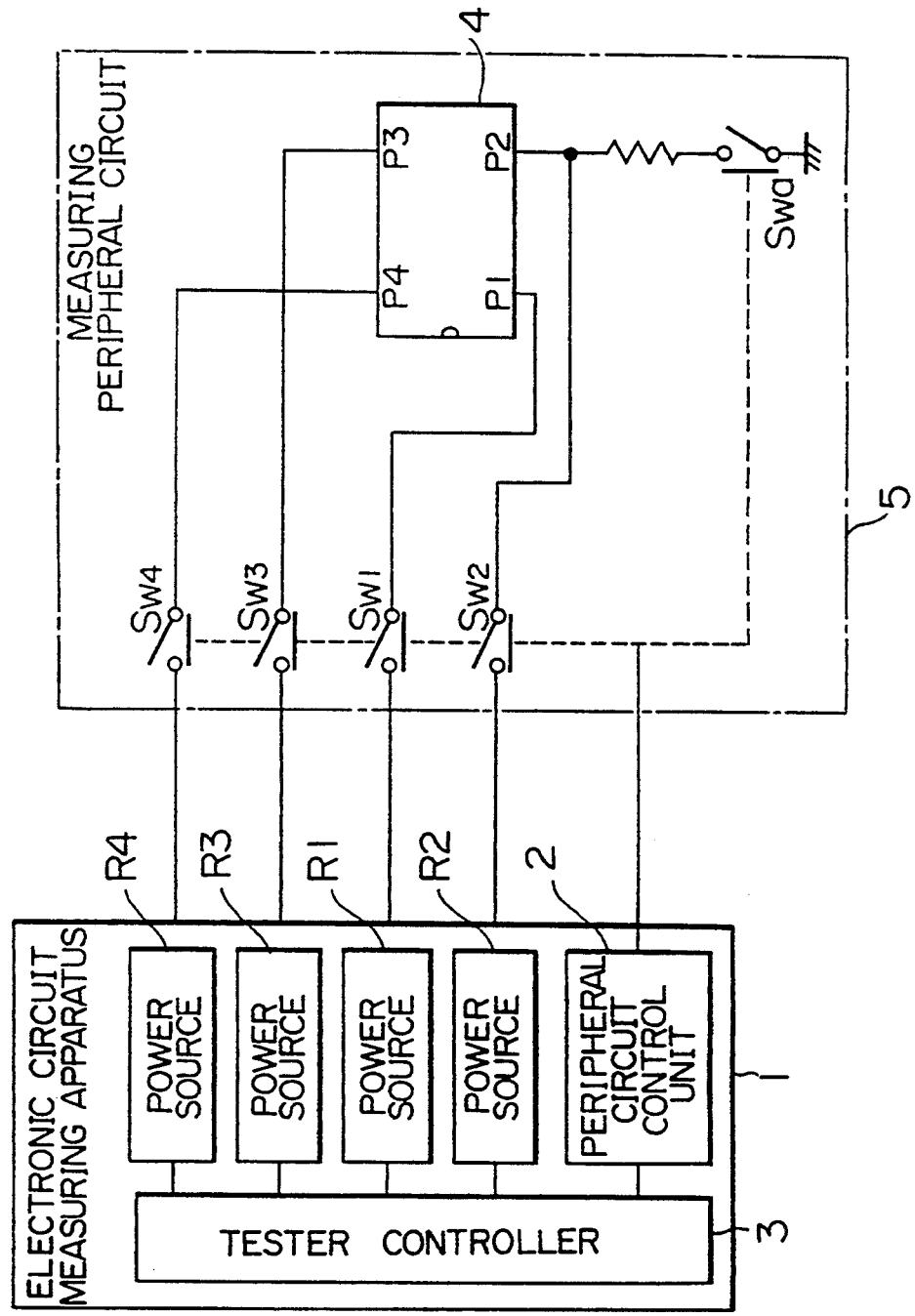
FIG. 5 is a block diagram which illustrates a conventional semiconductor measuring apparatus.

FIG. 4 is another embodiment of the semiconductor measuring apparatus according to the present invention which is arranged in such a manner that a voltage/current source 29 for only a monitor is employed. In the semiconductor measuring apparatus according to this embodiment, all of the voltage/current sources S1 to S24 are connected to the measuring test head 17. On the other hand, the voltage/current source 29 for a monitor is connected to a test head 28. The test head 28 has a switch 28a in a matrix configuration for selectively establishing a connection between the voltage/current source 29 for a monitor and a pin selected from the pins of the monitor terminal 21. Furthermore, the voltmeter 12 and the AC signal measuring device 14 are, via corresponding switches C28 and C29, connected to the monitor terminal 21 of the test head 28. The switching on/off operation performed by each of the switches 28a, C28 and C29 is controlled by a tester controller 11.

In a case where the electronic circuit measuring apparatus is arranged in such a manner that there are provided functions for only a monitor, that is, a predetermined voltage level application/measurement of an electric current and a predetermined current application/measurement of voltage, a structure may be arranged in such a manner that branching to the monitor program is performed whenever the setting condition extraction key appears in the test program and return to the test program is performed after a confirmation on the monitor program has been made. A debugging program processed as described above and in accordance with TEST1: Leakage Current 1 of the above-described test program is shown below.

| Execution Line No. | Description of Program |
|---|---|
| 5 | SET MODE = ? |

| Execution Line No. | Description of Program |
|---|---|
| 10 | TEST1: Leak current 1 |
| 20 | SET SW1 = ON, SW3 = ON |
| 30 | SET PIN1 = 0.4 V, MEAS. MODE = I |
| 35 | GOSUB MON1 |
| 40 | SET PIN3 = 0 V |
| 45 | GOSUB MON2 |
| 50 | MEAS PIN1 |
| 60 | JUDGE LO 1 µA, HI 3 µA |
| 1000 | MON1: |
| 1010 | CONNECT MON TO PIN1 |
| 1020 | JUDGE LO 0.36 V, HI 0.44 V |
| 1030 | RETURN |
| 1100 | MON2: |
| 1110 | CONNECT MON TO PIN2 |
| 1120 | JUDGE LO 0.36 V, HI 0.44 V |
| 1130 | RETURN |

According to the above-described debugging program, branching to monitor program MON1 (execution line Nos. 1000 to 1030) is performed an the execution line No. 35 in accordance with the set condition of execution No. 30 before a determination as to whether the set condition is satisfactory is made at the execution line No. 1020. On the other hand, branching to monitor program MON2 (execution line Nos. 1100 to 1130) is performed at the execution line No. 45 in accordance with the set condition of execution line No. 40 before a determination as to whether the set condition is satisfactory is made at the execution line No. 1120.

What is claimed is:

1. A method of preparing a debugging program for debugging a semiconductor measuring apparatus comprising:

reading a test program for measuring a circuit connected to a semiconductor measuring apparatus;

defining an extraction key for extracting a set condition from the test program during a measurement of a circuit, the measurement of the circuit being made under control of the test program;

defining a confirmation condition for confirming whether the set condition extracted from the test program is satisfactory;

preparing a monitor program for determining whether the set condition is satisfactory in accordance with the confirmation condition;

adding to the test program a branch command for branching to the monitor program;

adding to the monitor program a return command for returning to the test program; and transmitting a debugging program comprising the test program to which the branch command is added and the monitor program to which the return command is added.

2. A method according to claim 1 comprising adding a mode selecting description program for selecting a debugging program execution mode to the test program.

* * * * *